United States Patent
Zhong

(10) Patent No.: US 9,337,960 B2
(45) Date of Patent: May 10, 2016

(54) ENCODING AND DECODING METHODS AND APPARATUSES OF ETHERNET PHYSICAL LAYER

(71) Applicant: Huawei Technologies Co., Ltd., Shenzhen, Guangdong (CN)

(72) Inventor: Qiwen Zhong, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/868,784

(22) Filed: Sep. 29, 2015

(65) Prior Publication Data

US 2016/0020872 A1 Jan. 21, 2016

Related U.S. Application Data

(63) Continuation of application No. PCT/CN2013/073568, filed on Apr. 1, 2013.

(51) Int. Cl.
*H03M 7/30* (2006.01)
*H04L 1/00* (2006.01)
(Continued)

(52) U.S. Cl.
CPC .............. *H04L 1/0079* (2013.01); *H03M 7/30* (2013.01); *H04L 1/004* (2013.01); *H04L 45/74* (2013.01); *H04L 69/323* (2013.01)

(58) Field of Classification Search
CPC ..... H04L 1/0079; H04L 69/323; H04L 45/74; H04L 1/004; H03M 7/30
USPC ......................................................... 341/87
See application file for complete search history.

(56) References Cited

U.S. PATENT DOCUMENTS 7,447,228 B1 * 11/2008 Algie .................... H04J 3/1682
370/433
7,760,749 B2 * 7/2010 Wang ...................... H04L 25/14
370/412

(Continued)

FOREIGN PATENT DOCUMENTS

CN          1625859 A    6/2005
CN     101227450 A    7/2008

(Continued)

OTHER PUBLICATIONS

Zhang Peng, et al., "Design of codec for the physical layer of 100G Ethernet", Study on Optical Communications, 2009, 4 pages.

(Continued)

*Primary Examiner* — Brian Young

(57) ABSTRACT

The present invention discloses encoding and decoding methods and apparatuses of an Ethernet physical layer, the encoding method includes: determining a to-be-encoded first information group, where the first information group includes m characters, m≥2, and m is an integer, where a character attribute of any character is a data character, a boundary character, or a third-type character, and one character occupies one byte; detecting a character attribute of each character in the first information group; if the first information group includes n boundary characters, where n≥1, and n is an integer, deleting the n boundary characters, and generating a second information group by using a character, except the n boundary characters, in the first information group, and type information and position information that are of the n boundary characters, where the second information group includes m bytes; and adding header information to the second information group.

14 Claims, 8 Drawing Sheets

(51) Int. Cl.
*H04L 12/741* (2013.01)
*H04L 29/08* (2006.01)

(56) References Cited

U.S. PATENT DOCUMENTS

| | | | |
|---|---|---|---|
| 8,184,651 B2 * | 5/2012 | Chan | H04L 49/30 370/419 |
| 8,982,697 B2 * | 3/2015 | Ding | H04L 47/34 370/231 |
| 9,225,556 B2 * | 12/2015 | Chini | H04L 12/6418 |
| 2002/0156913 A1 | 10/2002 | Tsang et al. | |
| 2002/0159484 A1 | 10/2002 | Azizoglu et al. | |
| 2005/0005189 A1 | 1/2005 | Khermosh et al. | |
| 2005/0047433 A1 | 3/2005 | Rizer et al. | |
| 2009/0190595 A1 | 7/2009 | Jiang et al. | |
| 2009/0274172 A1 | 11/2009 | Shen et al. | |
| 2010/0080248 A1 | 4/2010 | Aweya et al. | |
| 2010/0091794 A1 | 4/2010 | Jiang | |
| 2012/0320915 A1 | 12/2012 | Barrass | |
| 2013/0235734 A1 | 9/2013 | Ding et al. | |

FOREIGN PATENT DOCUMENTS

| | | |
|---|---|---|
| CN | 101309258 A | 11/2008 |
| CN | 101330350 A | 12/2008 |
| CN | 101330503 A | 12/2008 |
| CN | 101369861 A | 2/2009 |
| CN | 101436955 A | 5/2009 |
| CN | 101610134 A | 12/2009 |

OTHER PUBLICATIONS

Wei Li, "Design and implementation of EPON 10G physical layer", 2010, 2 pages.

Roy Cideciyan, "256b/257b Transcoding for 100 Gb/s Backplane and Copper Cable", IEEE 802.3bj, Mar. 12-16, 2012, 21 pages.

"Interfaces for the Optical Transport Network (OTN)", Corrigendum 1, ITU-T G.709/Y.1331, Oct. 2012, 7 pages.

* cited by examiner

ENCODING AND DECODING METHODS AND APPARATUSES OF ETHERNET PHYSICAL LAYER

CROSS-REFERENCE TO RELATED APPLICATIONS

This application is a continuation of International Application No. PCT/CN2013/073568, filed Apr. 1, 2013, which is hereby incorporated by reference in its entirety.

TECHNICAL FIELD

The present invention relates to the field of communications technologies, and in particular, to encoding and decoding methods and apparatuses of an Ethernet physical layer.

BACKGROUND

An Ethernet is a data link layer and physical layer technology of a packet-based network. A data link layer of the Ethernet mainly includes a Media Access Control layer (Media Access Control, MAC for short) of the Ethernet. A physical layer of the Ethernet mainly includes: a reconciliation sub-layer (Reconciliation Sub-layer, RS for short), a media independent interface (Media Independent Interface, MII for short), a physical coding layer (Physical Coding Sublayer, PCS for short), a Physical Medium Attachment Sublayer (Physical Medium Attachment, PMA for short), a Physical Medium Dependent Sublayer (Physical Medium Dependent, PMD for short), an interface between a physical medium and each layer, and the like, where the RS is adaptive to the link layer and the physical layer, and provides required adaptation for the MAC and the physical layer to exchange data through the MII.

The PCS is used to encode an information group transmitted by the MIT, transmit an encoded information group to the PMA, decode the information group transmitted by the PMA, and transmit decoded information to the RS/MAC layer through the MIL At present, the most commonly used encoding manner is a 64b/66b encoding manner. In this manner, two types of two-bit (synchronous) header information (0b10, 0b01) are used to mark two types of encoded information groups; and types of the two encoded information groups mark the (synchronous) header information into two types according to whether characters in an information group are all data characters. When an information group does not include only a data character, a control character other than the data character in the information group is compressed and encoded, and a limited combination of the data character and the control character that are in the information group is recorded by using the first byte. The encoding manner is first widely used in a 10GE, and is also applied to a 40GE and a 100GE (100 Gigabit Ethernet).

In the 10GE, the 40GE, the 100GE, and a second generation 100GE, to reduce a redundancy overhead of a (synchronous) header, a 64b/66b to 512b/513b transcoding overhead compressing technology (Trasncoding) and a 64b/66b to 256b/257b transcoding overhead compressing technology are derived based on the 64b/66b encoding.

To adapt to the development of a large-capacity high-speed Ethernet such as a new-type 100GE, a 400GE (400 Gigabit Ethernet), a 1000GE (1000 Gigabit Ethernet), new requirements such as an optimal encoding overhead proportion, low complexity and high flexibility, and high implementation efficiency are put forward on an information group encoding technology of an Ethernet physical layer.

However, the foregoing encoding manner of the Ethernet physical layer has at least the following problems: a length of a to-be-encoded information group and a redundancy overhead of a (synchronous) header cannot be flexibly selected. On the one hand, selection and use of an optimal length of an encoded information group are limited, and therefore, optimal (synchronous) header overhead control is difficult to be implemented; on the other hand, selection of matched physical layer forward error correction (Forward Error Correction, FEC for short) encoding is limited.

SUMMARY

The present invention discloses encoding and decoding methods and apparatuses of an Ethernet physical layer, where the methods and apparatuses relate to the field of communications technologies and are used to increase encoding/decoding efficiency and flexibility of selecting a length of a to-be-encoded/decoded information group.

According to a first aspect, an encoding method of an Ethernet physical layer is provided, including:

determining a to-be-encoded first information group, where the first information group includes m characters, $m \geq 2$, and m is an integer, where a character attribute of any character is a data character, a boundary character, or a third-type character, one character occupies one byte, and the third-type character is a character except the data character and the boundary character;

detecting a character attribute of each character in the first information group;

if the first information group includes n boundary characters, where $n \geq 1$, and n is an integer, deleting the n boundary characters, and generating a second information group by using a character, except the n boundary characters, in the first information group, and type information and position information that are of the n boundary characters, where the second information group includes m bytes; and adding header information to the second information group according to a type of the first information group and a correspondence between a prestored type of a information group and a type of header information of the information group, where the type of the first information group is determined by the prestored type of the information group and character attributes of the characters in the first information group.

In a first possible implementation manner, with reference to the first aspect, the deleting the n boundary characters, and generating a second information group by using a character, except the n boundary characters, in the first information group, and type information and position information that are of the n boundary characters, where the second information group includes m bytes includes:

interchanging first n characters in the first information group and the n boundary characters, deleting the n boundary characters, and recording, in at least first n bytes of the first information group, the type information and the position information that are of the n boundary characters to obtain the second information group, where the second information group includes the m bytes; or deleting the n boundary characters to obtain n idle bytes; moving backward a character preceding the $n^{th}$ idle byte in the n idle bytes, so that remaining m-n characters in the first information group are recorded in consecutive bytes; and recording, in at least first n bytes of the first information group, the type information and the position information that are of the n boundary characters to obtain the second information group, where the second information group includes the m bytes.

In a second possible implementation manner, with reference to the first possible implementation manner, if n bytes occupied by the n boundary characters are sufficient to record the type information and the position information that are of the n boundary characters, the recording, in at least first n bytes of the first information group, the type information and the position information that are of the n boundary characters to obtain the second information group, where the second information group includes the m bytes includes:

recording, in first n bytes of the first information group, the type information and the position information that are of the n boundary characters to obtain the second information group, where the second information group includes the m bytes; or if n bytes occupied by the n boundary characters are not sufficient to record the type information and the position information that are of the n boundary characters, the recording, in at least first n bytes of the first information group, the type information and the position information that are of the n boundary characters to obtain the second information group, where the second information group includes the m bytes includes:

compressing at least one character of the remaining m-n characters in the first information group to make an idle bit appear in the front of the remaining m-n bytes, and recording, in first n bytes of the first information group and in the idle bit, the type information and the position information that are of the n boundary characters to obtain the second information group, where the second information group includes the m bytes.

In a third possible implementation manner, with reference to the first possible implementation manner, the adding header information to the second information group according to a type that is of the first information group and determined by character attributes of the characters in the first information group includes:

if n bytes occupied by the n boundary characters are not sufficient to record the type information and the position information that are of the n boundary characters, adding the header information to the second information group according to the type that is of the first information group and determined by the character attributes of the characters in the first information group, where the header information is used to mark the type of the first information group.

In a fourth possible implementation manner, with reference to any one of the first aspect and the first possible implementation manner to the third possible implementation manner, m≤64; and if the prestored type of the information group is an all-data-character type and a non-all-data-character type, the header information of the information group includes at least two types; or if the prestored type of the information group is an all-data-character type, an all-third-type-character type, and a boundary-character-included type, the header information of the information group includes at least three types.

In a fifth possible implementation manner, with reference to the first aspect, if the characters in the first information group are all third-type characters, the method further includes:

compressing at least one third-type character to make an idle bit appear in the front of the first information group; recording, in the idle bit, that the characters in the first information group are all third-type characters to obtain a third information group, where the third information group includes m bytes; and adding header information to the third information group according to the type of the first information group and the correspondence between the prestored type of the information group and the type of the header information of the information group; or adding header information to the first information group according to the type of the first information group and the correspondence between the prestored type of the information group and the type of the header information of the information group, where the header information of the first information group is used to mark that the characters in the first information group are all third-type characters.

According to a second aspect, a decoding method of an Ethernet physical layer is provided, including:

determining a to-be-decoded second information group and header information of the second information group, where the second information group includes m bytes, m≥2, and m is an integer;

determining, according to the header information of the second information group and a prestored type of the information group, that the second information group includes type information and position information that are of n boundary characters, where n≥1, and n is an integer; or that the second information group includes information that characters are all third-type characters; and if the second information group includes the type information and the position information that are of the n boundary characters, obtaining n to-be-added boundary characters according to the type information and the position information that are of the n boundary characters, deleting the type information and the position information that are of the n boundary characters, and generating a first information group by using the n to-be-added boundary characters and the characters in the second information group, where the first information group includes m bytes; or if the second information group includes the information that characters are all third-type characters, deleting the information that characters are all third-type characters, and decompressing a character in the second information group to obtain a first information group, where the first information group includes m bytes.

In a first possible implementation manner, with reference the second aspect, if the type information and the position information that are of the n boundary characters are recorded in first n bytes of the second information group, the generating a first information group by using the to-be-added boundary characters and the characters in the second information group, where the first information group includes m bytes includes: adding the n to-be-added boundary characters to the second information group to obtain the first information group; or if the type information and the position information that are of the n boundary characters are recorded not only in first n bytes of the second information group, the generating a first information group by using the n to-be-added boundary characters and the characters in the second information group, where the first information group includes m bytes includes: decompressing a character in the second information group, and adding the n to-be-added boundary characters to the second information group that is obtained after the decompression to obtain the first information group.

According to a third aspect, an encoding apparatus is provided, including: a determining unit, a detecting unit, a generating unit, and an adding unit, where the determining unit is configured to determine a to-be-encoded first information group, where the first information group includes m characters, m≥2, and m is an integer, where a character attribute of any character is a data character, a boundary character, or a third-type character, one character occupies one byte, and the third-type character is a character except the data character and the boundary character;

the detecting unit is configured to detect a character attribute of each character in the first information group;

the generating unit is configured to: if the first information group includes n boundary characters, where n≥1, and n is an integer, delete the n boundary characters, and generate a second information group by using a character, except the n boundary characters, in the first information group, and type information and position information that are of the n boundary characters, where the second information group includes m bytes; and the adding unit is configured to add header information to the second information group according to a type of the first information group and a correspondence between a prestored type of the information group and a type of header information of the information group, where the type of the first information group is determined by the prestored type of the information group and character attributes of the characters in the first information group.

In a first possible implementation manner, with reference to the third aspect, the generating unit is specifically configured to:

interchange first n characters in the first information group and the n boundary characters, delete the n boundary characters, and record, in at least first n bytes of the first information group, the type information and the position information that are of the n boundary characters to obtain the second information group, where the second information group includes the m bytes; or delete the n boundary characters to obtain n idle bytes; move backward a character preceding the n$^{th}$ idle byte in the n idle bytes, so that remaining m-n characters in the first information group are recorded in consecutive bytes; and record, in at least first n bytes of the first information group, the type information and the position information that are of the n boundary characters to obtain the second information group, where the second information group includes the m bytes.

In a second possible implementation manner, with reference to the first possible implementation manner, the generating unit is specifically configured to:

if n bytes occupied by the n boundary characters are sufficient to record the type information and the position information that are of the n boundary characters, record, in first n bytes of the first information group, the type information and the position information that are of the n boundary characters to obtain the second information group, where the second information group includes the m bytes; or if n bytes occupied by the n boundary characters are not sufficient to record the type information and the position information that are of the n boundary characters, compress at least one character of the remaining m-n characters in the first information group, so as to make an idle bit appear in the front of the remaining m-n bytes, and record, in first n bytes of the first information group and in the idle bit, the type information and the position information that are of the n boundary characters to obtain the second information group, where the second information group includes the m bytes.

In a third possible implementation manner, with reference to the first possible implementation manner, the adding unit is specifically configured to: if n bytes occupied by the n boundary characters are not sufficient to record the type information and the position information that are of the n boundary characters, add the header information to the second information group according to the type that is of the first information group and determined by the character attributes of the characters in the first information group, where the header information is used to mark the type of the first information group.

In a fourth possible implementation manner, with reference to any one of the third aspect and the first possible implementation manner to the third possible implementation manner, m≤64; and if the prestored type of the information group is an all-data-character type and a non-all-data-character type, the header information of the information group includes at least two types; or if the prestored type of the information group is an all-data-character type, an all-third-type-character type, and a boundary-character-included type, the header information of the information group includes at least three types.

In a fifth possible implementation manner, with reference to the third aspect, if the characters in the first information group are all third-type characters, the apparatus further includes a compressing unit, where the compressing unit is configured to compress at least one third-type character to make an idle bit appear in the front of the first information group; the generating unit is further configured to record, in the idle bit, that the characters in the first information group are all third-type characters to obtain a third information group, where the third information group includes m bytes; and the adding unit is further configured to add header information to the third information group according to the type of the first information group and the correspondence between the prestored type of the information group and the type of the header information of the information group; or the adding unit is further configured to add header information to the first information group according to the type of the first information group and the correspondence between the prestored type of the information group and the type of the header information of the information group, where the header information of the first information group is used to mark that the characters in the first information group are all third-type characters.

According to a fourth aspect, a decoding apparatus is provided, including: a determining unit and a generating unit, where the determining unit is configured to: determine a to-be-decoded second information group and header information of the second information group, where the second information group includes m bytes, m≥2, and m is an integer; and determine, according to the header information of the second information group and a prestored type of the information group, that the second information group includes type information and position information that are of n boundary characters, where n≥1, and n is an integer; or that the second information group includes information that characters are all third-type characters; and the generating unit is configured to: if the second information group includes the type information and the position information that are of the n boundary characters, obtain n to-be-added boundary characters according to the type information and the position information that are of the n boundary characters, delete the type information and the position information that are of the n boundary characters, and generate a first information group by using the n to-be-added boundary characters and the characters in the second information group, where the first information group includes m bytes; or if the second information group includes the information that characters are all third-type characters, delete the information that characters are all third-type characters, and decompress a character in the second information group to obtain a first information group, where the first information group includes m bytes.

In a first possible implementation manner, with reference to the fourth aspect, if the type information and the position information that are of the n boundary characters are recorded in first n bytes of the second information group, the generating unit is specifically configured to add the n to-be-added boundary characters to the second information group to obtain the first information group; or if the type information and the position information that are of the n boundary characters are recorded not only in first n bytes of the second information group, the generating unit is specifically configured to: decompress a character in the second information group, and add the n to-be-added boundary characters to the second information group that is obtained after the decompression to obtain the first information group.

According to the encoding and decoding methods and apparatuses of an Ethernet physical layer that are provided by the embodiments of the present invention, in a first information group of a length of at least two bytes and including n boundary characters, where n≥1, the n boundary characters are deleted; a second information group is generated by using a character except the n boundary characters, and type information and position information that are of the n boundary characters; and header information is added to the second information group, thereby implementing encoding of the first information group; or a second information group is decoded by using a method corresponding to the foregoing method to obtain a first information group. This increases encoding/decoding efficiency and flexibility of selecting a length of a to-be-encoded/decoded information group.

BRIEF DESCRIPTION OF THE DRAWINGS

To describe the technical solutions in the embodiments of the present invention more clearly, the following briefly introduces the accompanying drawings required for describing the embodiments or the prior art. Apparently, the accompanying drawings in the following description show merely some embodiments of the present invention, and persons of ordinary skill in the art may still derive other drawings from these accompanying drawings without creative efforts.

DETAILED DESCRIPTION

The following describes encoding and decoding methods and apparatuses of an Ethernet physical layer that are provided by embodiments of the present invention in detail with reference to the accompanying drawings.

Figure 1:
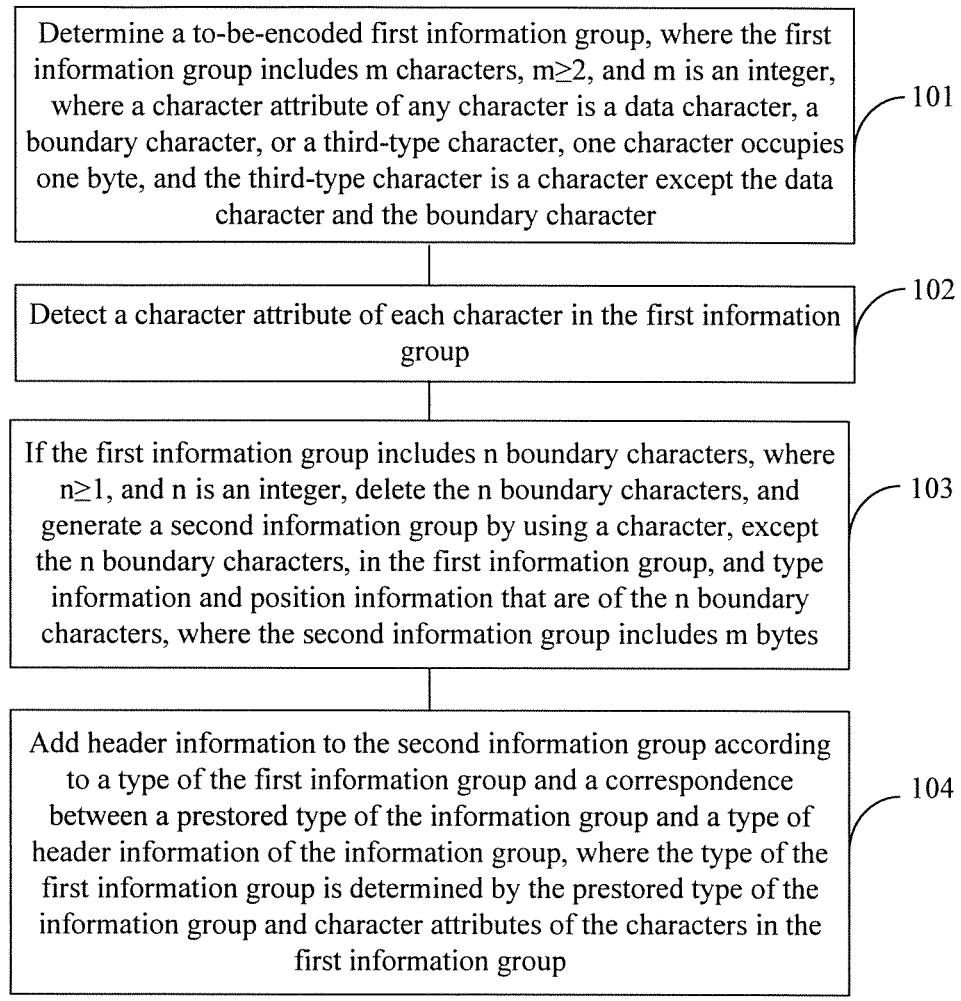
FIG. 1 is a flowchart of an encoding method according to an embodiment of the present invention.

According to one aspect, referring to FIG. 1, FIG. 1 shows an encoding method of an Ethernet physical layer according to an embodiment of the present invention, and the method includes:

101: Determine a to-be-encoded first information group, where the first information group includes m characters, m≥2, and m is an integer, where a character attribute of any character is a data character, a boundary character, or a third-type character, one character occupies one byte, and the third-type character is a character except the data character and the boundary character.

Exemplarily, the encoding method provided by this embodiment of the present invention is mainly applied to an Ethernet, and specifically relates to encoding performed by an Ethernet physical coding layer PCS on information data on an MII interface.

An Ethernet is a packet-based network technology which uses a byte as a smallest unit, and the MII is a bidirectional character-based interface. The MII continuously transmits an information group to the PCS, where the information group generally uses a combination of eight-bit transmit or receive (character) data (Transmit/Receive Data, TXD/RXD for short) and one-bit transmit or receive (character) control (signal) (Transmit/Receive (character) Control (signal), TXC/RXC for short) as a basic unit.

The information group is generally formed by one or multiple basic units, each basic unit records one character, and a character attribute of each character may be a data character, a boundary character, or a third-type character.

The following introduces a transmission form of the information group.

A concept of a packet needs to be introduced first: in a case in which a preamble byte and a start of frame delimiter are not included, one packet may include at least 64 bytes, and may include at most 1518 bytes. A packet specifically includes: a six-byte destination address, a six-byte source address, a two-byte packet type/length information, and at-least-46-byte packet payload information and padding information. In a case in which a seven-byte preamble byte and a one-byte start of frame delimiter are included, one packet includes at least 72 bytes, and includes at most 1526 bytes.

It should be noted that in this embodiment of the present invention, characters of all bytes included in one packet are collectively referred to as data characters and represented by a /D/. Generally, a first byte of a preamble may be marked as an /S/ (Start), a next byte after one packet ends may be marked as a /T/(terminator), and the /S/ and the /T/ are referred to as boundary characters.

Consecutive characters between packets are referred to as inter-packet gaps (Inter-Packet Gap, IPG for short), and may be marked as an /I/ (Idle). Because the /I/ is a determined character with no information, and people sometimes transmit other useful information on a position of the /I/, some /I/s are replaced with other characters with useful information. The present invention imposes no limitation on whether /I/s are replaced with other characters, and the /I/s and the other characters are not distinguished in subsequent descriptions, are collectively referred to as third-type characters, and are marked as /I/s.

When no packet is transmitted, the MII continuously transmits an /I/ to the PCS; and when a packet is transmitted, the MII transmits the packet to the PCS. When a packet includes a preamble byte and a start of frame delimiter, the IPG includes at least 12 bytes.

In conclusion, a transmission form of an information group may be: . . . an /I/, an /S/, a packet, a /T/, at least 12 /I/s, an /S/, a packet . . . .

The number of basic units of information groups that are transmitted each time by the MII may be determined by a transmission mode used by the MII, for example, a transmission mode of a 10GE (10 Gigabit Ethernet) is using an interface bit width of four basic units, that is, a 10 Gbps 10GE media independent interface (10 Gbps Media Independent Interface, XGMII for short) works with an interface bit width of TXD/RXD[0:31]+TXC/RXC[0:3], (8+1)*4=36 bits and at a clock rate of 312.5 MHz; and a transmission mode of a 40GE (40 Gigabit Ethernet) is using an interface bit width of eight basic units, that is, a 40 Gbps 40GE media independent interface (40 Gbps Media Independent Inteface, XLGMII for short) works with an interface bit width of TXD/RXD[0:63]+TXC/RXC[0:7], (8+1)*8-72 bits and at a clock rate of 625 MHz.

After receiving the information group transmitted by the MII, the PCS determines the to-be-encoded first information group, where the first information group may include at least two bytes. For example, consecutive 56 bytes, 64 bytes, or 70 bytes may be selected from the information group to serve as the first information group.

Exemplarily, core content of encoding may include: if the first information group includes a boundary character, a type of the first information group, and a type and a position that are of the boundary character are indicated.

102: Detect a character attribute of each character in the first information group.

Exemplarily, each character in an input information group and an output information group that are of the PCS is transmitted in "TXD+TXC" form, that is, each character includes TXC/RXC indication information, where TXC /RXC=0 is used to indicate that the character is a data character; and TXC /RXC=1 is used to indicate that the character is a non-data character, and the non-data character may be either of a boundary character or a third-type character. In a case in which TXC=1, with reference to the character itself, it is further determined that the character is the boundary character or the third-type character. Therefore, a character attribute of the character may be detected by detecting a TXC corresponding to each character and the character itself.

103: If the first information group includes n boundary characters, n≥1, and n is an integer, delete the n boundary characters, and generate a second information group by using a character, except the n boundary characters, in the first information group, and type information and position information that are of the n boundary characters, where the second information group includes m bytes.

Exemplarily, the second information group is formed by a character, except the n boundary characters, in the first information group, and type information and position information that are of the n boundary characters, and a length of the second information group is the same as a length of the first information group. The type information of the n boundary characters may include: each boundary character is an /S/ or a /T/, and a combination manner of the n boundary characters. For example, if n=2, type information of the two boundary characters is /T//S/ or /S//T/; and if n=1, type information of the one boundary character is /T/ or /S/. The position information of the n boundary characters may include that each boundary character is located in which byte of the first information group.

Generally, the type information and the position information that are of the n boundary characters are recorded in at least first n bytes in the front of the second information group, and the character, except the n boundary characters, in the first information group is recorded in a remaining byte of the second information group.

Further, a specific implementation manner of obtaining the second information group by using the first information group in step 103 may include but is not limited to the following two cases:

A first case: interchanging first n characters in the first information group and the n boundary characters; deleting the n boundary characters; and recording, in at least first n bytes of the first information group, the type information and the position information that are of the n boundary characters to obtain the second information group, where the second information group includes the m bytes.

Exemplarily, in this case, two operation steps, that is, deleting and interchanging, are included, and an execution sequence of the two steps is not limited, that is, it may be deleting first and then interchanging, or may be interchanging first and then deleting.

A second case: deleting the n boundary characters to obtain n idle bytes; moving backward a character preceding the $n^{th}$ idle byte in the n idle bytes, so that remaining m-n characters in the first information group are recorded in consecutive bytes; and recording, in at least first n bytes of the first information group, the type information and the position information that are of the n boundary characters to obtain the second information group, where the second information group includes the m bytes.

Exemplarily, in this case, two operation steps, that is, deleting and moving, are included.

Generally, the second case has more operation steps than that of the first case, and therefore, the first case is used as an exemplary implementation manner.

Further, according to whether n bytes occupied by the n boundary characters are sufficient to record the type information and the position information that are of the n boundary characters, the operation step "recording, in at least first n bytes of the first information group, the type information and the position information that are of the n boundary characters to obtain the second information group, where the second information group includes the m bytes" may be specifically implemented in the following two cases:

(1) If the n bytes occupied by the n boundary characters are sufficient to record the type information and the position information that are of the n boundary characters,
recording, in first n bytes of the first information group, the type information and the position information that are of the n boundary characters to obtain the second information group, where the second information group includes the m bytes.

Exemplarily, it can be learned according to a transmission form of an information stream that, generally, when the number of characters included in the first information group is less than or equal to 64, the n bytes occupied by the n boundary characters in the first information group are sufficient to record the type information and the position information that are of the n boundary characters, and in this case, there is no need to compress a character in the first information group.

(2) If the n bytes occupied by the n boundary characters are not sufficient to record the type information and the position information that are of the n boundary characters,
compressing at least one character of the remaining m-n characters in the first information group to make an idle bit appear in the front of the remaining m-n bytes, and recording, in first n bytes of the first information group and in the idle bit, the type information and the position information that are of the n boundary characters to obtain the second information group, where the second information group includes the m bytes.

Exemplarily, when the first information group includes 256 ( ) characters, that is, when m=256, eight bits may be used to identify a position of one boundary character. The first n bytes of the first information group may record the position information of the n boundary characters, but there is no idle byte to record the type information of the n boundary characters. A to-be-compressed byte may be determined according to space needs to be occupied for recording the type information of the n boundary characters. For example, when n=2, a character in the $(n+1)^{th}$ byte of the first information group may be compressed into six bits, or a character in the $(n+1)^{th}$ byte and a character in the $(n+2)^{th}$ byte that are of the first information group are separately compressed into seven bits.

104: Add header information to the second information group according to a type of the first information group and a correspondence between a prestored type of a information group and a type of header information of the information group, where the type of the first information group is determined by the prestored type of the information group and character attributes of the characters in the first information group.

Exemplarily, the header information may be used to identify the type of the first information group, or identify, together with the header information of the first information group, the type of the first information group. If the first information group includes n boundary characters, the header information of the first information group may be type information and position information that are of the n boundary characters; and if the characters in the first information group are all third-type characters, the header information of the first information group may be information that identifies that the characters in the first information group are all third-type characters.

Further, step 104 may include: if n bytes occupied by the n boundary characters are not sufficient to record the type information and the position information that are of the n boundary characters, adding the header information to the second information group according to the type that is of the first information group and determined by the character attributes of the characters in the first information group, where the header information is used to mark the type of the first information group.

Exemplarily, an application scenario of the implementation method is the same as that of the implementation method in the foregoing (2), that is, the implementation method and the implementation method of the foregoing (2) are two implementation methods in the scenario in which "the n bytes occupied by the n boundary characters are not sufficient to record the type information and the position information that are of the n boundary characters". Compared with the implementation method of the foregoing (2), in the implementation method, there is no need to compress a character, and the type of the first information group is marked in the header information.

For example, when m=256 and n=2, position information of each boundary character needs to be marked by using one byte, idle bytes obtained after the two boundary characters are deleted are only sufficient to mark position information of the two boundary characters, that is, there is no idle bit that can mark type information of the two boundary characters, and the type information may fall, according to different sequences of the two boundary characters, into two types: /S//T/ and /T//S/, therefore, two different types of header information may be used to mark the two types.

Further, if the characters in the first information group are all third-type characters, the method further includes:
compressing at least one third-type character to make an idle bit appear in the front of the first information group; recording, in the idle bit, that the characters in the first information group are all third-type characters to obtain a third information group, where the third information group includes m bytes; and adding header information to the third information group according to the type of the first information group and the correspondence between the prestored type of the information group and the type of the header information of the information group, where exemplarily, content of the header information may be the same as that of the foregoing header information added to the second information group; or
adding header information to the first information group according to the type of the first information group and the correspondence between the prestored type of the information group and the type of the header information of the information group, where the header information of the first information group is used to mark that the characters in the first information group are all third-type characters. Exemplarily, in the implementation method, a character is not compressed, and the header information is used to mark that the characters in the first information group are all third-type characters.

Further, m≤64, and if the prestored type of the information group is an all-data-character type and a non-all-data-character type, the header information of the information group includes at least two types; or if the prestored type of the information group is an all-data-character type, an all-third-type-character type, and a boundary-character-included type, the header information of the information group includes at least three types.

Exemplarily, the type of the header information may be the same as the preset type of the information group, and the preset type of the information group may have at least two types (A/B) or at least three types (A/B/C), where type C may be further divided into C1/C2, and the like.

For example, if the preset type of the information group is two types: an all-data-character type and a non-all-data-character type, and optionally, one-bit header information is used to mark the two types; optionally. When it is detected that a character attribute of each character in the first information group is a data character, the header information of the first information group is marked as 0; and conversely, the header information of the first information group is marked as 1.

If the preset type of the information group is at least three types: an all-data-character type, an all-third-type-character type, and a boundary-character-included type. Optionally, at-least-two-bit header information is used to mark the three or more types; optionally, when it is detected that a character attribute of each character in the first information group is a third-type character, the header information of the first information group is marked as C (or is alternately marked as C1:00 and C2:11, so as to ensure the number of 1 and the number of 0 are comparable); when it is detected that the character attribute of each character in the first information group is a data character, the header information of the first information group is marked as A:01; and when it is detected that a character attribute of at least one character in the first information group is a boundary character, the header information of the first information group is marked as B:10. A case of three bits or more is by analogy with that.

Certainly, the preset type of the information group may be further another type, which is not limited in this embodiment; and even though the prestored type of the information group falls within the cases mentioned above, the header information of the first information group may also be marked in another manner, which is not limited in this embodiment. In addition, a bit occupied by the header information of the first information group is not limited either in this embodiment.

Further, if the characters in the first information group are all data characters, an encoding method for the first information group is: adding header information to the first information group.

It should be noted that, at present, in a case in which a preamble byte and a start of frame delimiter are not included, an Ethernet packet includes at least 64 bytes, and an inter-packet gap is at least 12 bytes; when the number m of bytes included in the first information group is greater than or equal to 76, the first information group may include at most three boundary characters, which brings in a more complex case for encoding, and when the first information group included in the first information group exceeds 76 bytes, there is a little significance from a perspective of reducing an overhead. Therefore, in actual application, m≤64 may be properly selected to perform encoding on the first information group. Correspondingly, in a case in which the packet includes the preamble byte and the start of frame delimiter, m≤72 may be properly selected to perform encoding on the first information group. However, the method provided by this embodiment of the present invention is also applicable to a scenario in which m>64 in a case in which the packet does not include the preamble byte and the start of frame delimiter (or m>72 in a case in which the packet includes the preamble byte and the start of frame delimiter).

Further, the encoding method provided by this embodiment of the present invention is byte-based encoding. On the one hand, a length of the to-be-encoded first information group may be flexibly selected, so that FEC may be flexibly selected; on the other hand, the method is simple to operate and easy to implement, thereby increasing encoding efficiency.

According to the encoding method of an Ethernet physical layer provided by this embodiment of the present invention, in a first information group of a length of at least two bytes and including n boundary characters, where n≥1, the n boundary characters are deleted; a second information group is generated by using a character except the n boundary characters, and type information and position information that are of the n boundary characters; and header information is added to the second information group, thereby implementing encoding of the first information group. This increases encoding efficiency and flexibility of selecting a length of a to-be-encoded information group.

The following describes the foregoing encoding method in detail by using a specific embodiment.

Figure 2:
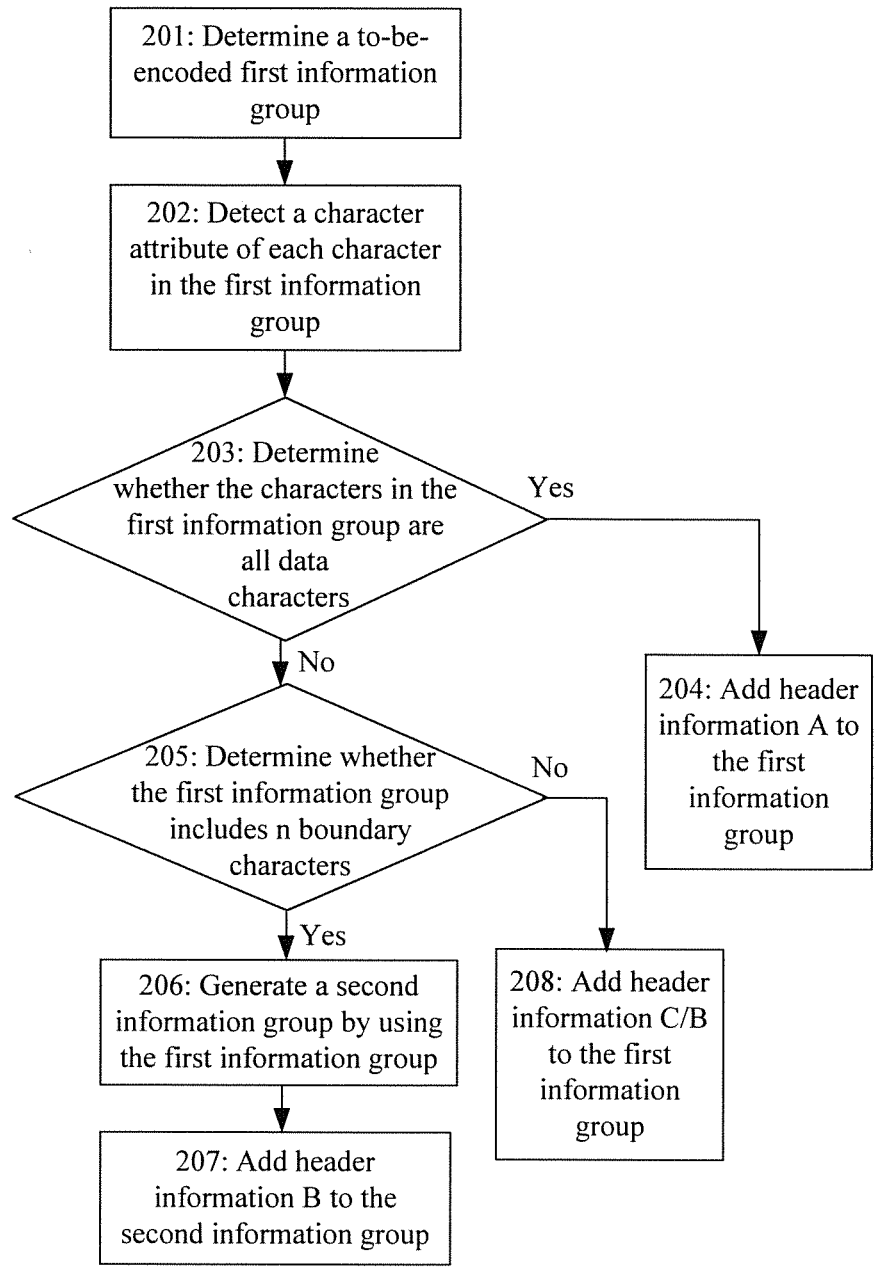
FIG. 2 is a flowchart of a method for generating a second information group according to an embodiment of the present invention.

Referring to FIG. 2, the method includes:

201: Determine a to-be-encoded first information group.

In this embodiment, it is assumed that the first information group includes 64 characters (a preamble byte or a start of frame delimiter is not included in a packet), and it is assumed that a type of the first information group is an all-data-character type (type A), a boundary-character-included type (type B), and an all-third-type-character type (type C). It can be learned according to a transmission mode of an information group that, possible combination manners of 64 consecutive characters include:

a first manner: all are third-type characters /I/s; type C;

a second manner: a third-type character /I/ and a boundary character /S/ are included; type B;

a third manner: a third-type character /I/, a boundary character /S/, and a data character ID/ are included; type B;

a fourth manner: a boundary character /S/ and a data character /D/ are included; type B;

a fifth manner: a data character /D/ is included; type A;

a sixth manner: a data character /D/ and a boundary character /T/ are included; type B;

a seventh manner: a data character /D/, a boundary character /T/, and a third-type character /I/ are included; type B;

an eighth manner: a data character /D/, a boundary character /T/, a third-type character /I/, and a boundary character /S/ are included; type B;

a ninth manner: a boundary character /T/, a third-type character /I/, and a boundary character /S/ are included; type B; and a tenth manner: a boundary character /T/ and a third-type character /I/ are included; type B.

The following introduces representations of header information of the 64-byte first information group.

The first information group may include at most two boundary characters, and referring to Table 1, Table 1 shows several representations of the header information of the first information group, where TS is used to mark whether there is a boundary character /T/ or /S/ in the first information group, and TS=00, 01, 10, and 11 indicate the following four cases, respectively: the first information group does not include a /T/ or an /S/, only includes an /S/, only includes a /T/, and includes a /T/ and an /S/.

TABLE 1

| Type of Header Information | All-data-character Type A | Boundary-character-included Type B (TS = 01/10/11) | All-third-type-character Type C (00) |
|---|---|---|---|
| Header information 0 (two bits) | A: 01 | B: 10 | C: 00 |
| Header information 1 (two bits) | A: 01 | B: 10 | C1: 00, C2: 11 |
| Header information 2 (four bits) | A: 0011 | B: 1100 | C: 0101 |
| Header information 3 (four bits) | A: 0011 | B: 1100 | C: 1010 |
| Header information 4 (four bits) | A: 0011 | B: 1100 | C1: 0101, C2: 1010 |

In this embodiment, it is assumed that a relationship between a prestored type of the first information group and the header information of the first information group is shown in Table 2.

TABLE 2

| Type of First Information Group | All-data-character Type | All-third-type-character Type | Boundary-character-included Type | | |
|---|---|---|---|---|---|
| Header information 2 TS | A: 01 | C: 00 TS = 00 | B: 10 TS = 10 | B: 10 TS = 01 | B: 10 TS = 11 |

202: Detect a character attribute of each character in the first information group.

Detection result: the type of the first information group is any one of the all-data-character type (type A), the boundary-character-included type (type B), and the all-third-type-character type (type C).

203: Determine whether the characters in the first information group are all data characters.

204: If yes, add header information A to the first information group.

Exemplarily, in this case, the characters in the first information group are 64 /D/s, and it can be learned with reference to Table 2 that the header information of the first information group may be represented by A:01, and therefore, an encoding result of the first information group may be: header information (01) and 64 /D/s.

205: If no, determine whether the first information group includes n boundary characters.

206: If yes, generate a second information group by using the first information group.

Specific implementation steps may be: interchanging first n characters in the first information group and the n boundary characters; deleting the n boundary characters to obtain n idle bytes; and recording, in the n idle bytes, type information and position information that are of the boundary characters.

The following describes representations of type information and position information of a boundary character.

When the first information group includes 64 ($2^6$) characters, there may be at most two boundary characters in the first information group, and therefore, two bits may be used to mark type information (TS=00: all are third-type characters; TS=10: there is a T but there is no S; TS=01: there is no T but there is an S; and TS=11: there is a T and an S) of the boundary characters in the first information group. For example, when the type of the first information group is any one of the second, the third, and the fourth combination manner, type information of the boundary character in the first information group may be marked as TS=01 to indicate that only one boundary character an /S/ is included; when the type of the first information group is any one of the sixth, the seventh, and the tenth combination manner, type information of the boundary character in the first information group may be marked as TS=10 to indicate that only one boundary character a /T/ is included; and when the type of the first information group is any one of the eighth and the ninth combination manner, type information of the boundary characters in the first information group may be marked as TS=11 to indicate that two boundary characters are included, where the first one is a /T/, and the second one is an /S/.

When the first information group includes 64 ($2^6$) characters, six bits may be used to mark a position of a boundary character that is recorded in any byte of the first information group, that is, six bits may be used to record position information of the boundary character in the first information group. For example, it is assumed that the first information group includes 64 characters, which sequentially are: 30 /D/s, a /T/, 12 /I/s, an /S/, and 20 /D/s, position information of the /T/ may be represented by six bits: T-POS-011110, and position information of the /S/ may be represented by six bits: S-POS-101011.

The following describes a method for generating a second information group in an encoding process by using an example in which a first information group is: 30 /D/s, a /T/, 12 /I/s, an /S/, and 20 /D/s.

Figure 3:
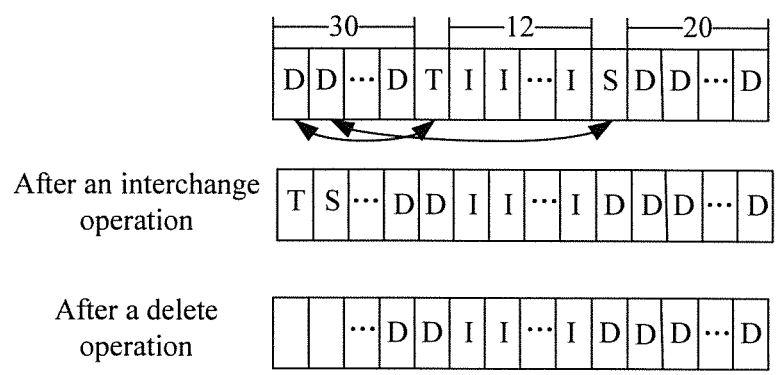
FIG. 3 is a schematic diagram of a method for generating a second information group according to an embodiment of the present invention.

1) Referring to FIG. 3,

Step 1: Interchange first two characters in the first information group and the two boundary characters, that is, perform interchanging operation on the first character in the first information group and the /T/, and perform interchanging operation on the second character in the first information group and the /S/.

Step 2: Delete the two boundary characters, where after the boundary characters are deleted, first two bytes of the first information group become idle bytes.

Step 3: Record, in the first two bytes (the idle bytes obtained after the boundary characters are deleted in FIG. 2) of the first information group, type information TS=11 and position information T-POS, S-POS that are of the two boundary characters to obtain the second information group, where the second information group includes 64 bytes; and a sequence of the boundary characters is /T//S/, and the type information and the position information that are of the two boundary characters and recorded in the first two bytes of the first information group are: 11-011110-RR-101011, where R represents one reserved bit; 11 (TS=11) in first two bits represents that the first information group includes two boundary characters and the sequence of the boundary characters is /T//S/, the first one is the /T/, the second one is the /S/, 011110 represents position information T-POS of the /T/, and 101011 represents position information S-POS of the /S/. It should be noted that the first two bytes include 16 bits, the type information and the position information that are of the two boundary characters occupy 14 bits in total, and therefore, two bits RR may be reserved.

Figure 4:
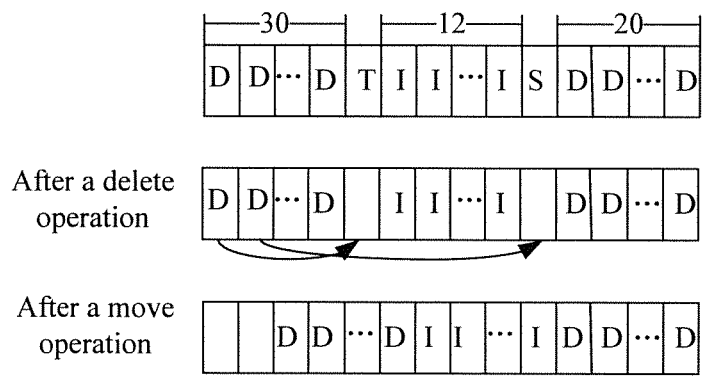
FIG. 4 is a schematic diagram of another method for generating a second information group according to an embodiment of the present invention.

2) Referring to FIG. 4,

Step 1: Delete the two boundary characters to obtain two idle bytes;

Step 2: Move characters that are between the first third-type character and the second idle byte (that is, the $32^{th}$ character to the $43^{th}$ character that are in the first information group) a byte backward in sequence; and move characters that are before the first idle byte (that is, the first character to the $30^{th}$ character that are of the first information group) two bytes backward in sequence.

Step 3: which is the same as Step 3 in the forgoing 1), and details are not described herein again.

In addition, the following introduces another method for recording position information of a boundary symbol, where the method may be applied to some scenarios in which a position of an /S/ or a /T/ is limited.

A 64b/66b encoding manner is generally used for encoding in a 40GE/100GE. If it is considered to perform transcoding on the 64b/66b encoded data method in the 40GE/100GE by using the present invention, for example, performing transcoding on eight 64b/66b code blocks, where each block includes eight bytes, 8×8=64 bytes, that is, the first information group includes m=64 bytes.

Because it is limited in the 40GE/100GE that if there is an /S/ in a 64b/66b code block, the /S/ can appear only in the first byte of the 64b/66b code block. Therefore, in the first information group of 64 bytes corresponding to the eight 64b/66b code blocks, the /S/ can appear only at eight positions: POS=0, 8, 16, 24, 32, 40, 48, 56. Therefore, position information of the IS/ may be recorded by using only three bits. A method for recording position information of a /T/, a method for recording type information of a boundary character, a method for marking header information, and operation steps of obtaining a second information group are the same as the methods in the foregoing specific embodiment. For example, it is assumed that the first information group is: eight /Us, an /S/, and 55 /D/s; a preset sequence of boundary characters is /T//S/; and header information of the first information group is 10. An encoding result of the first information group may be: header information (01), type information of the boundary character (01), a position of the /S/ is the second position in POS=0, 8, 16, 24, 32, 40, 48, 56, which is represented by information (001), and if S-POS exclusively occupies one byte, five reserved bits Rs and 55 /D/s remain.

By comparing the method with the method in the foregoing specific embodiment, it can be learned that the former has a relatively small application range, but the number of reserved bits increases by using the method in an applicable range, and these reserved bits may be used to mark other functions, which are not limited in this embodiment; and the latter has a wide application range, and may be applicable to an encoding process of any first information group.

207: Add header information B to the second information group.

Exemplarily, an encoding result of the first information group is: header information (B:10), type information (11) of a combination of the boundary characters, position information of the boundary characters (T-POS:011111, S-POS: 101011), two reserved bits RR, 30 /D/s, 12 /I/s, and 20 /D/s.

It should be noted that a result of step 3 is neither mentioned in FIG. 3 nor in FIG. 4, and the result of step 3 is the encoding result.

208: If no, add header information C (C=B:01 or other header information: C1 or C2) to the first information group.

Exemplarily, in this case, the first information group is 64 /I/s; it can be learned with reference to Table 1 that the header information of the first information group may be represented by C, and for a case in which the type of the header information in Table 1 is header information 2 (two bits), the case can be uniquely marked by using the header information; therefore the encoding result of the first information group may be: header information (C:00) and 64 /I/s.

This embodiment may further include the following cases:

Types of an information group include an all-data-character type and a non-all-data-character type, and a relationship between the type of the first information group and a type of header information may be shown in Table 3. In this case, a boundary-character-included type and an all-control-character type may be distinguished by using type information marked with TS.

TABLE 3

| Type of Header Information | All-data-character Type | Non-all-data-character Type |
| --- | --- | --- |
| Header information 0 (one bit) | A: 0 | B: 1 |
| Header information 1 (two bits) | A: 01 | B: 10 |

Header information 0 in Table 3 is used as an example for illustration in the following.

In step 204, the encoding result of the first information group may be: header information A (0) and 64 /D/s. The encoding result of the first information group in step 207 is: header information B (1), type information TS (11) of the boundary characters, position information (T-POS:011110, S-POS:101011) of the boundary characters, two reserved bits RR, 30 /D/s, 12 /I/s, and 20 /D/s.

In step 208, because it cannot be distinguished, only according to the header information, whether the first information group includes a boundary character, information TS=00 that the characters are all third-type characters needs to be marked in the front of the first information group. In step 207, the first two bits of the first information group are used to mark the type information of the boundary characters, and the sequence of the boundary characters is /T//S/; it can be learned from step 207 that 00 is not used to mark the type information of the boundary characters, and therefore, 00 may be used to mark the information that the characters in the first information group are all third-type characters. In this case, step 208 may include: compressing the first character in the first information group to obtain two idle bits, and marking the bits as 00. Therefore, the encoding result of the first information group may be: header information (1), information (00) that marks the characters in the first information group are all third-type characters, a six-bit compressed /Ic/, and 63 /I/s; or header information (1), information (00) that mark the characters in the first information group are all third-type characters, a seven-bit compressed /Ic1/, a seven-bit /Ic2/, and 62 /I/s.

According to the encoding method of an Ethernet physical layer provided by this embodiment of the present invention, in a first information group of a length of at least two bytes and including n boundary characters, where n≥1, the n boundary characters are deleted; a second information group is generated by using a character except the n boundary characters, and type information and position information that are of the n boundary characters; and header information is added to the second information group, thereby implementing encoding of the first information group. This increases encoding efficiency and flexibility of selecting a length of a to-be-encoded information group.

Figure 5:
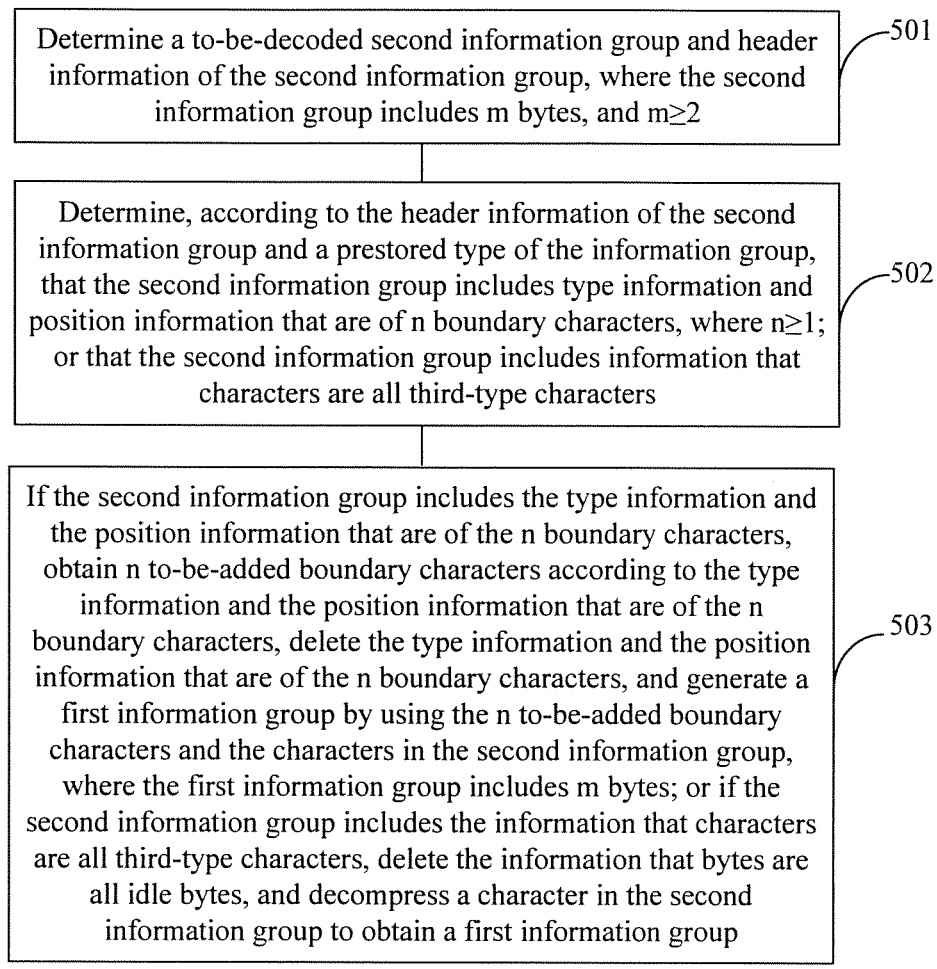
FIG. 5 is a flowchart of a decoding method according to an embodiment of the present invention.

According to one aspect, referring to FIG. 5, FIG. 5 shows a decoding method of an Ethernet physical layer provided by an embodiment of the present invention, where the method includes:

501: Determine a to-be-decoded second information group and header information of the second information group, where the second information group includes m bytes, and m≥2.

Exemplarily, the decoding method provided by this embodiment of the present invention is corresponding to the encoding method in the foregoing embodiment, and is an inverse process of the foregoing encoding method, which, therefore, is only briefly described.

A PMA transmits an information group to a PCS, where the information group is a to-be-decoded information group; the PCS determines a length of the second information group according to a preset length of the to-be-decoded information group, and determines the header information of the second information group according to a preset bit occupied by header information of the information group.

502: Determine, according to the header information of the second information group and a prestored type of the information group, that the second information group includes type information and position information that are of n boundary characters, where n≥1; or that the second information group includes information that characters are all third-type characters.

Exemplarily, it can be learned from the foregoing encoding method that a type of the second information group may be any one of a boundary-character-included type, an all-third-type-character type, and an all-data-character type. When the type of the second information group is the all-data-character type, because, in this embodiment, the header information is not considered to be a part of the second information group, there is no need to decode the second information group. It should be noted that, if the header information is considered to be a part of the second information group, in this case, decoding of the second information group is to remove the header information.

503: If the second information group includes the type information and the position information that are of the n boundary characters, obtain n to-be-added boundary characters according to the type information and the position information that are of the n boundary characters, delete the type information and the position information that are of the n boundary characters, and generate a first information group by using the n to-be-added boundary characters and the characters in the second information group, where the first information group includes m bytes; or if the second information group includes the information that characters are all third-type characters, delete the information that bytes are all idle bytes, and decompress a character in the second information group to obtain a first information group.

Further, if the type information and the position information that are of the n boundary characters are recorded in first n bytes of the second information group, the generating a first information group by using the n to-be-added boundary characters and the characters in the second information group, where the first information group includes m bytes includes: adding the n to-be-added boundary characters to the second information group to obtain the first information group; or if the type information and the position information that are of the n boundary characters are recorded not only in first n bytes of the second information group, the generating a first information group by using the n to-be-added boundary characters and the characters in the second information group, where the first information group includes m bytes includes: decompressing a character in the second information group, and adding the n to-be-added boundary characters to the second information group that is obtained after the decompression to obtain the first information group.

Exemplarily, because the embodiment of the foregoing encoding method is described in detail, and this embodiment is merely the inverse process of the foregoing encoding method, that is, if a step in the foregoing encoding method is compressing a first information group, to which a step in the decoding method is corresponding is decompressing a second information group; if a step in the foregoing encoding method is deleting a boundary character and recording type information and position information that are of the boundary character in the first information group, to which a step in the decoding method is corresponding is adding a boundary character according to type information and position information that are of the boundary character and deleting the type information and the position information that are of the boundary character; and the like. Details are not described herein again.

According to the decoding method of an Ethernet physical layer provided by this embodiment of the present invention, a second information group of a length of at least two bytes is determined; when the second information group includes type information and position information that are of a boundary character, n boundary characters are added, and the type information and the position information that are of the boundary character are deleted, and a first information group with a same number of bytes as the second information group is generated by using n to-be-added boundary characters and characters in the second information group, thereby completing decoding; or when the second information group includes information that characters are all third-type characters, the information that bytes are all idle bytes is deleted, and a character in the second information group is decompressed to obtain a first information group with a same number of bytes as the second information group, thereby completing decoding. This increases decoding efficiency and flexibility of selecting a length of a to-be-decoded information group.

The following describes the foregoing decoding method in detail by using two specific embodiments.

In the two embodiments, both of selected second information groups include 64 characters (a preamble byte or a start of frame delimiter is not included in a packet). Type information of the second information group is recorded in first two characters in the second information group, and is separately represented by 00/01/10/11, where 00 represents that the second information group does not include a /T/ or an /S/, 01 represents that the second information group includes only an /S/, 10 represents that the second information group includes only a /T/, and 11 represents that the second information group includes a /T/ and an /S/. In the two embodiments, a first information group is generated after the second information group is decoded.

Embodiment 1

It is assumed that a type of the second information group is an all-data-character type (type A), a boundary-character-included type (type B), and an all-third-type-character type (type C). A relationship between the type of the second information group and header information of the second information group is shown in Table 2.

Figure 6:
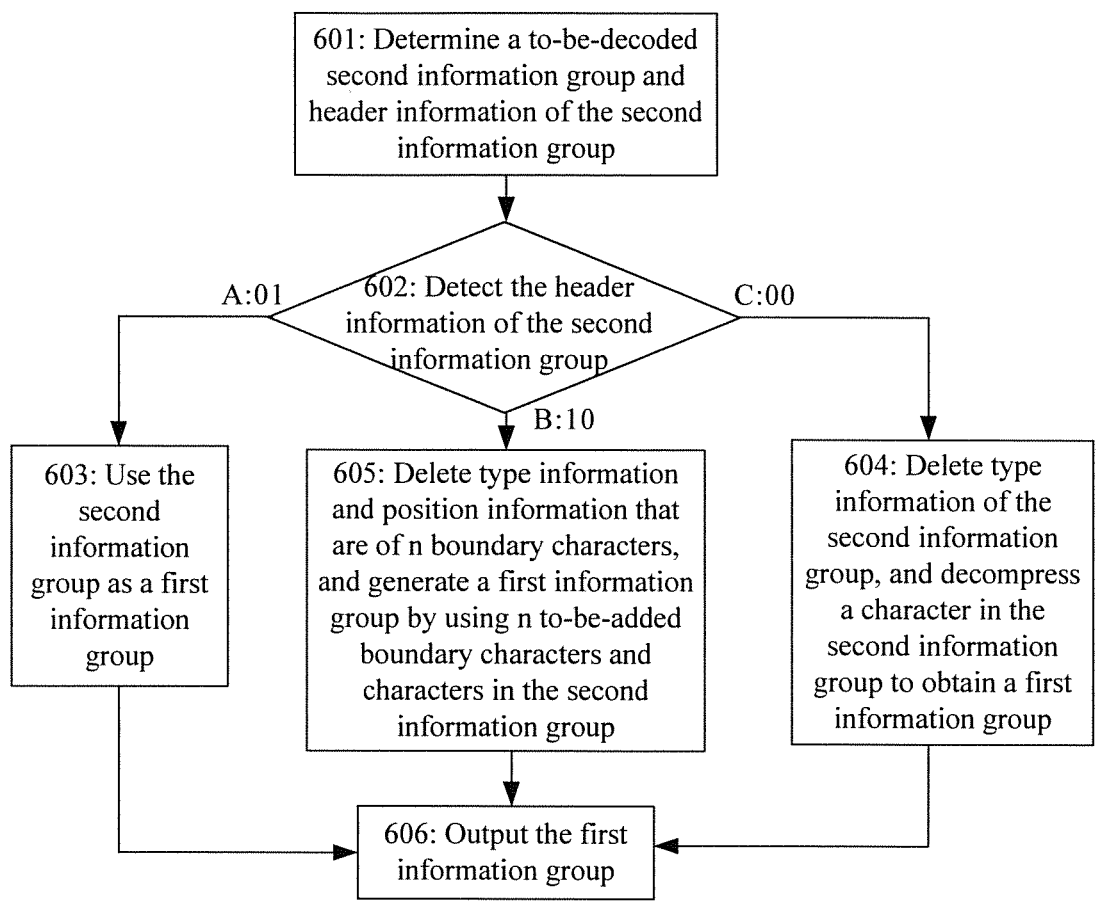
FIG. 6 is a schematic diagram of a decoding method according to an embodiment of the present invention.

Referring to FIG. 6, the method includes:

601: Determine a to-be-decoded second information group and header information of the second information group.

Exemplarily, the header information of the second information group includes any one of A:01, B:10, and C:00.

602: Detect the header information of the second information group.

603: If the header information of the second information group is: A:01, use the second information group as a first information group.

604: If the header information of the second information group is: C:00, delete type information that is of the second information group and recorded in first two bits of the second information group, and decompress a character in the second information group to obtain a first information group.

605: If the header information of the second information group is: B:10, delete type information and position information that are of n boundary characters, where n may be 0, or 2; and generate a first information group by using n to-be-added boundary characters and characters in the second information group.

Exemplarily, the n to-be-added boundary characters may be determined according to type information and position information that are of the second information group.

606: Output the first information group.

Embodiment 2

It is assumed that a type of header information of a second information group is header information 0 in Table 3, if a type of the second information group is a non-data-symbol type, type information of the second information group is recorded in first two characters in the second information group, and is separately represented by 00/01/10/11.

Figure 7:
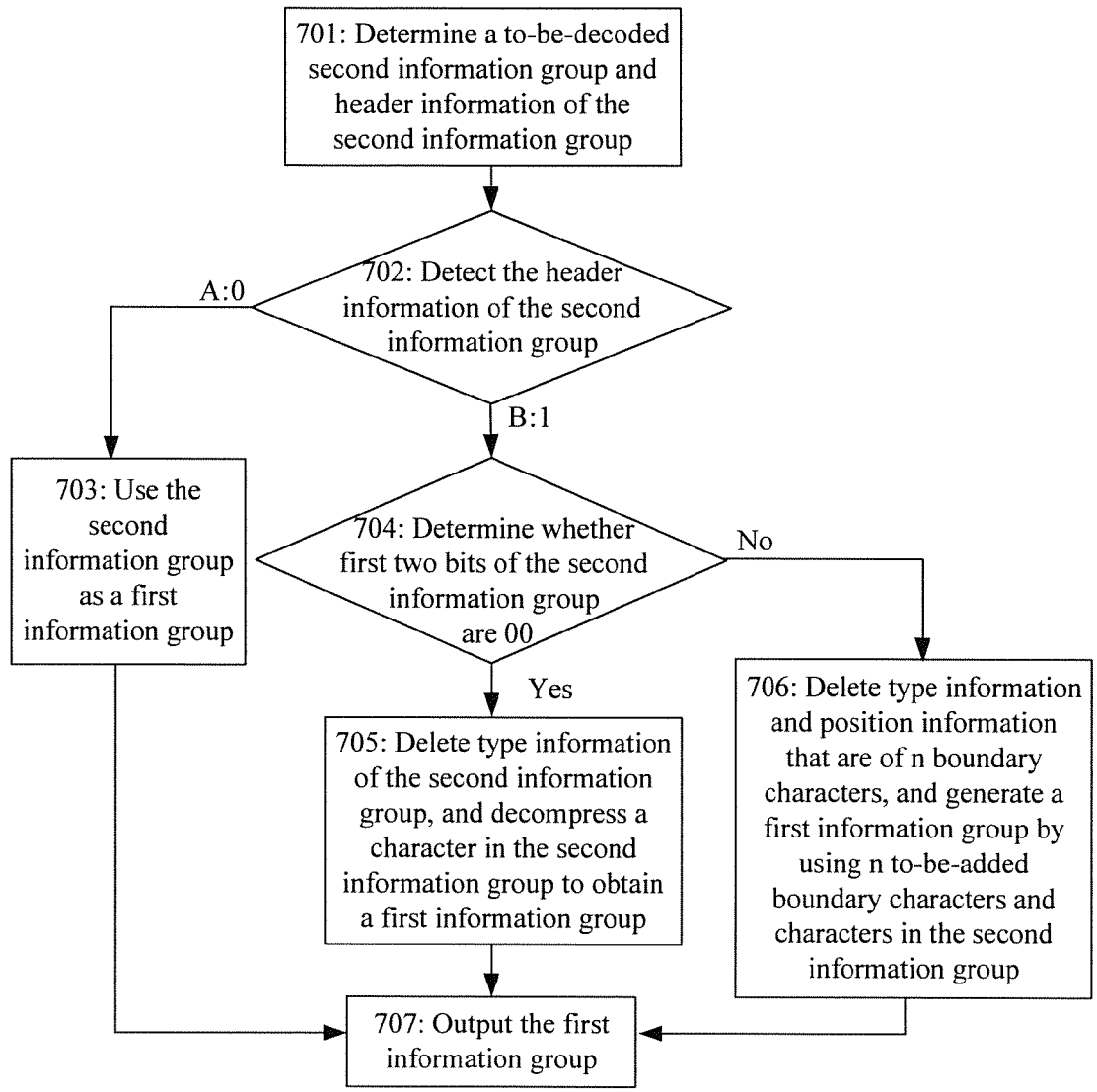
FIG. 7 is a schematic diagram of another decoding method according to an embodiment of the present invention.

Referring to FIG. 7, the method includes:

701: Determine a to-be-decoded second information group and header information of the second information group.

702: Detect the header information of the second information group.

703: If the header information of the second information group is: A:0, use the second information group as a first information group.

704: If the header information of the second information group is: B:1, determine whether first two bits of the second information group are 00.

705: If yes, delete type information that is of the second information group and recorded in the first two bits of the second information group, and decompress a character in the second information group to obtain a first information group.

706: If no, delete type information and position information that are of n boundary characters, where n may be 0, 1, or 2; and generate a first information group by using n to-be-added boundary characters and characters in the second information group.

Exemplarily, the n to-be-added boundary characters may be determined according to type information and position information that are of the second information group.

707: Output the first information group.

According to the decoding method of an Ethernet physical layer provided by this embodiment of the present invention, a second information group of a length of at least two bytes is determined; when the second information group includes type information and position information that are of a boundary character, n boundary characters are added, and the type information and the position information that are of the boundary character are deleted, and a first information group with a same number of bytes as the second information group is generated by using n to-be-added boundary characters and characters in the second information group, thereby completing decoding; or when the second information group includes information that characters are all third-type characters, the information that bytes are all idle bytes is deleted, and a character in the second information group is decompressed to obtain a first information group with a same number of bytes as the second information group, thereby completing decoding. This increases decoding efficiency and flexibility of selecting a length of a to-be-decoded information group.

Figure 8:
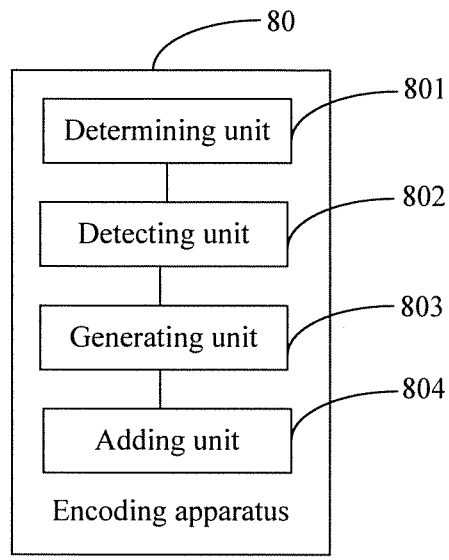
FIG. 8 is a schematic structural diagram of an encoding apparatus according to an embodiment of the present invention.

According to one aspect, referring to FIG. 8, FIG. 8 shows an encoding apparatus 80 provided by an embodiment of the present invention, and the encoding apparatus 80 is configured to execute the encoding method described in FIG. 1 and includes: a determining unit 801, a detecting unit 802, a generating unit 803, and an adding unit 804.

The determining unit 801 is configured to determine a to-be-encoded first information group, where the first information group includes m characters, m≥2, and m is an integer, where a character attribute of any character is a data character, a boundary character, or a third-type character, one character occupies one byte, and the third-type character is a character except the data character and the boundary character.

The detecting unit 802 is configured to detect a character attribute of each character in the first information group.

The generating unit 803 is configured to: if the first information group includes n boundary characters, where n≥1, and n is an integer, delete the n boundary characters, and generate a second information group by using a character, except the n boundary characters, in the first information group, and type information and position information that are of the n boundary characters, where the second information group includes m bytes.

The adding unit 804 is configured to add header information to the second information group according to a type of the first information group and a correspondence between a prestored type of a information group and a type of header information of the information group, where the type of the first information group is determined by the prestored type of the information group and character attributes of the characters in the first information group.

Further, the generating unit 803 may be specifically configured to:
interchange first n characters in the first information group and the n boundary characters, delete the n boundary characters, and record, in at least first n bytes of the first information group, the type information and the position information that are of the n boundary characters to obtain the second information group, where the second information group includes the m bytes; or
delete the n boundary characters to obtain n idle bytes; move backward a character preceding the $n^{th}$ idle byte in the n idle bytes, so that remaining m-n characters in the first information group are recorded in consecutive bytes; and record, in at least first n bytes of the first information group, the type information and the position information that are of the n boundary characters to obtain the second information group, where the second information group includes the m bytes.

Further, the generating unit 803 may be specifically configured to:
if n bytes occupied by the n boundary characters are sufficient to record the type information and the position information that are of the n boundary characters, record, in first n bytes of the first information group, the type information and the position information that are of the n boundary characters to obtain the second information group, where the second information group includes the m bytes; or if n bytes occupied by the n boundary characters are not sufficient to record the type information and the position information that are of the n boundary characters, compress at least one character of the remaining m-n characters in the first information group, so as to make an idle bit appear in the front of the remaining m-n bytes, and record, in first n bytes of the first information group and in the idle bit, the type information and the position information that are of the n boundary characters to obtain the second information group, where the second information group includes the m bytes.

Further, the adding unit 804 may be specifically configured to: if the n bytes occupied by the n boundary characters are not sufficient to record the type information and the position information that are of the n boundary characters, add the header information to the second information group according to the type that is of the first information group and determined by the character attributes of the characters in the first information group, where the header information is used to mark the type of the first information group.

Optionally, m≤64, and if the prestored type of the information group is an all-data-character type and a non-all-data-character type, the header information of the information group includes at least two types; or if the prestored type of the information group is an all-data-character type, an all-third-type-character type, and a boundary-character-included type, the header information of the information group includes at least three types.

Figure 9:
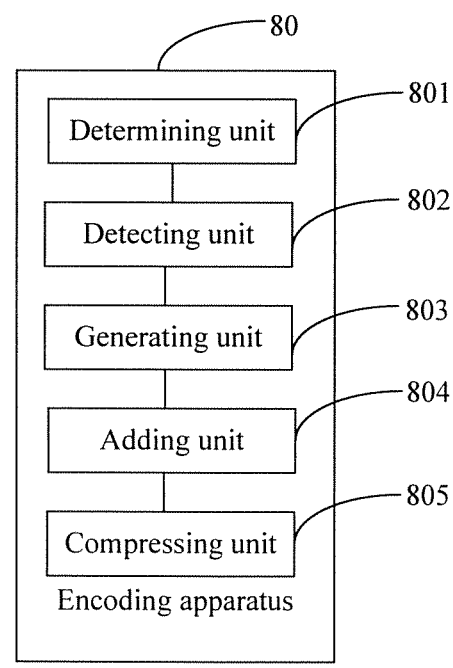
FIG. 9 is a schematic structural diagram of another encoding apparatus according to an embodiment of the present invention.

Further, if the characters in the first information group are all third-type characters, refer to FIG. 9, and the apparatus 80 further includes a compressing unit 805, where the compressing unit 805 is configured to compress at least one third-type character to make an idle bit appear in the front of the first information group; the generating unit 803 may be further configured to record, in the idle bit, that the characters in the first information group are all third-type characters to obtain a third information group, where the third information group includes m bytes; and the adding unit 804 may be further configured to add header information to the third information group according to the type of the first information group and the correspondence between the prestored type of the information group and the type of the header information of the information group; or the adding unit 804 may be further configured to add header information to the first information group according to the type of the first information group and the correspondence between the prestored type of the information group and the type of the header information of the information group, where the header information of the first information group is used to mark that the characters in the first information group are all third-type characters.

According to the encoding apparatus provided by this embodiment of the present invention, in a first information group of a length of at least two bytes and including n boundary characters, where n≥1, the n boundary characters are deleted; a second information group is generated by using a character except the n boundary characters, and type information and position information that are of the n boundary characters; and header information is added to the second information group, thereby implementing encoding of the first information group. This increases encoding efficiency and flexibility of selecting a length of a to-be-encoded information group.

Figure 10:
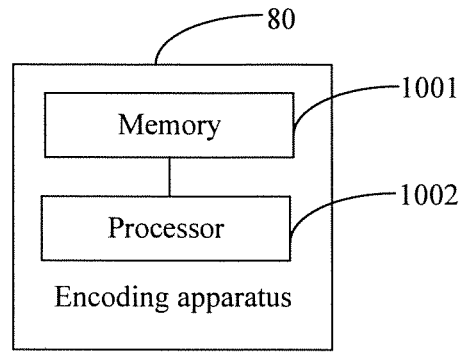
FIG. 10 is a schematic structural diagram of another encoding apparatus according to an embodiment of the present invention.

According to one aspect, referring to FIG. 10, FIG. 10 shows another encoding apparatus 80 provided by an embodiment of the present invention, and the encoding apparatus 80 is configured to execute the encoding method described in FIG. 1 and includes: a memory 1001 and a processor 1002.

The memory 1001 is configured to store a group of code, where the code is used to control the processor 1002 to execute the following actions:

determining a to-be-encoded first information group, where the first information group includes m characters, m≥2, and m is an integer, where a character attribute of any character is a data character, a boundary character, or a third-type character, one character occupies one byte, and the third-type character is a character except the data character and the boundary character;

detecting a character attribute of each character in the first information group;

if the first information group includes n boundary characters, where n≥1, and n is an integer, deleting the n boundary characters, and generating a second information group by using a character, except the n boundary characters, in the first information group, and type information and position information that are of the n boundary characters, where the second information group includes m bytes; and adding header information to the second information group according to a type of the first information group and a correspondence between a prestored type of a information group and a type of header information of the information group, where the type of the first information group is determined by the prestored type of the information group and character attributes of the characters in the first information group.

Further, if the characters in the first information group are all third-type characters, the processor 1002 is further configured to execute the following actions:

compressing at least one third-type character to make an idle bit appear in the front of the first information group; recording, in the idle bit, that the characters in the first information group are all third-type characters to obtain a third information group, where the third information group includes m bytes; and adding header information to the third information group according to the type of the first information group and the correspondence between the prestored type of the information group and the type of the header information of the information group; or adding header information to the first information group according to the type of the first information group and the correspondence between the prestored type of the information group and the type of the header information of the information group, where the header information of the first information group is used to mark that the characters in the first information group are all third-type characters.

According to the encoding apparatus provided by this embodiment of the present invention, in a first information group of a length of at least two bytes and including n boundary characters, where n≥1, the n boundary characters are deleted; a second information group is generated by using a character except the n boundary characters, and type information and position information that are of the n boundary characters; and header information is added to the second information group, thereby implementing encoding of the first information group. This increases encoding efficiency and flexibility of selecting a length of a to-be-encoded information group.

Figure 11:
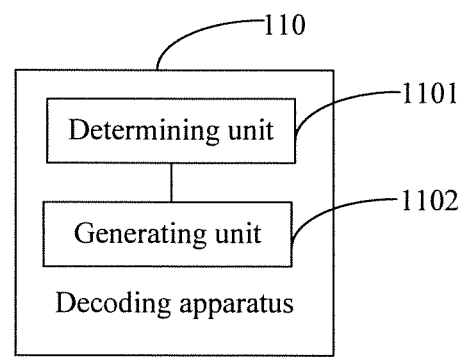
FIG. 11 is a schematic structural diagram of a decoding apparatus according to an embodiment of the present invention.

According to one aspect, referring to FIG. 11, FIG. 11 shows a decoding apparatus 110 provided by an embodiment of the present invention, and the decoding apparatus 110 is configured to execute the decoding method shown in FIG. 5 and includes: a determining unit 1101 and a generating unit 1102.

The determining unit 1101 is configured to: determine a to-be-decoded second information group and header information of the second information group, where the second information group includes m bytes, m≥2, and m is an integer; and determine, according to the header information of the second information group and a prestored type of the information group, that the second information group includes type information and position information that are of n boundary characters, where n≥1, and n is an integer; or that the second information group includes information that characters are all third-type characters.

The generating unit 1102 is configured to: if the second information group includes the type information and the position information that are of the n boundary characters, obtain n to-be-added boundary characters according to the type information and the position information that are of the n boundary characters, delete the type information and the position information that are of the n boundary characters, and generate a first information group by using the n to-be-added boundary characters and characters in the second information group, where the first information group includes m bytes; or if the second information group includes the information that characters are all third-type characters, delete the information that characters are all third-type characters, and decompress a character in the second information group to obtain a first information group, where the first information group includes m bytes.

Further, if the type information and the position information that are of the n boundary characters are recorded in first n bytes of the second information group, the generating unit 1102 may be specifically configured to add the n to-be-added boundary characters to the second information group to obtain the first information group; or if the type information and the position information that are of the n boundary characters are recorded not only in first n bytes of the second information group, the generating unit 1102 may be specifically configured to: decompress a character in the second information group, and add the n to-be-added boundary characters to the second information group that is obtained after the decompression to obtain the first information group.

According to the decoding apparatus provided by this embodiment of the present invention, a second information group of a length of at least two bytes is determined; when the second information group includes type information and position information that are of a boundary character, n boundary characters are added, the type information and the position information that are of the boundary character are deleted, and a first information group with a same number of bytes as the second information group is generated by using n to-be-added boundary characters and characters in the second information group, thereby completing decoding; or when the second information group includes information that characters are all third-type characters, the information that bytes are all idle bytes is deleted, and a character in the second information group is decompressed to obtain a first information group with a same number of bytes as the second information group, thereby completing decoding. This increases decoding efficiency and flexibility of selecting a length of a to-be-decoded information group.

Figure 12:
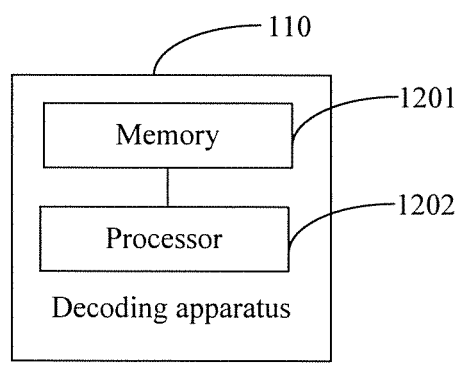
FIG. 12 is a schematic structural diagram of another decoding apparatus according to an embodiment of the present invention.

According to one aspect, referring to FIG. 12, FIG. 12 shows a decoding apparatus 110 provided by an embodiment of the present invention, and the decoding apparatus 110 is configured to execute the decoding method shown in FIG. 5 and includes: a memory 1201 and a processor 1202.

The memory 1201 is configured to store a group of code, where the code is used to control the processor 1202 to execute the following actions:

determining a to-be-decoded second information group and header information of the second information group, where the second information group includes m bytes, m≥2, and m is an integer;

determining, according to the header information of the second information group and a prestored type of the information group, that the second information group includes type information and position information that are of n boundary characters, where n≥1, and n is an integer; or that the second information group includes information that characters are all third-type characters; and if the second information group includes the type information and the position information that are of the n boundary characters, obtaining n to-be-added boundary characters according to the type information and the position information that are of the n boundary characters, deleting the type information and the position information that are of the n boundary characters, and generating a first information group by using the n to-be-added boundary characters and characters in the second information group, where the first information group includes m bytes; or if the second information group includes the information that characters are all third-type characters, deleting the information that characters are all third-type characters, and decompressing a character in the second information group to obtain a first information group, where the first information group includes m bytes.

According to the decoding apparatus provided by this embodiment of the present invention, a second information group of a length of at least two bytes is determined; when the second information group includes type information and position information that are of a boundary character, n boundary characters are added, the type information and the position information that are of the boundary character are deleted, and a first information group with a same number of bytes as the second information group is generated by using n to-be-added boundary characters and characters in the second information group, thereby completing decoding; or when the second information group includes information that characters are all third-type characters, the information that bytes are all idle bytes is deleted, and a character in the second information group is decompressed to obtain a first information group with a same number of bytes as the second information group, thereby completing decoding. This increases decoding efficiency and flexibility of selecting a length of a to-be-decoded information group.

It may be clearly understood by persons skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit. The integrated unit may be implemented in a form of hardware, or may be implemented in a form of hardware in addition to a software functional unit.

When the foregoing integrated unit is implemented in a form of a software functional unit, the integrated unit may be stored in a computer-readable storage medium. The software functional unit is stored in a storage medium and includes several instructions for instructing a computer device (which may be a personal computer, a server, or a network device) to perform some of the steps of the methods described in the embodiments of the present invention. The foregoing storage medium includes: any medium that can store program code, such as a USB flash drive, a removable hard disk, a read-only memory (Read-Only Memory, ROM for short), a random access memory (Random Access Memory, RAM for short), a magnetic disk, or an optical disc.

What should be noted at last is that: The foregoing embodiments are merely intended for describing the technical solutions of the present invention, but not for limiting the present invention. Although the present invention is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of the present invention.

What is claimed is:

1. An encoding method of an Ethernet physical layer, the method comprising:
    determining a to-be-encoded first information group, wherein the first information group comprises m characters, m≥2, and m is an integer, wherein a character attribute of any character is a data character, a boundary character, or a third-type character, one character occupies one byte, and the third-type character is a character except the data character and the boundary character;
    detecting a character attribute of each character in the first information group;
    if the first information group comprises n boundary characters, wherein n≥1, and n is an integer, deleting the n boundary characters, and generating a second information group by using a character, except the n boundary characters, in the first information group, and type information and position information that are of the n boundary characters, wherein the second information group comprises m bytes; and
    adding header information to the second information group according to a type of the first information group and a correspondence between a prestored type of a information group and a type of header information of the information group, wherein the type of the first information group is determined by the prestored type of the information group and character attributes of the characters in the first information group.

2. The encoding method according to claim 1, wherein deleting the n boundary characters, and generating a second information group by using a character, except the n boundary characters, in the first information group, and type information and position information that are of the n boundary characters, wherein the second information group comprises m bytes comprises:
    interchanging first n characters in the first information group and the n boundary characters, deleting the n boundary characters, and recording, in at least first n bytes of the first information group, the type information and the position information that are of the n boundary characters to obtain the second information group, wherein the second information group comprises the m bytes; or
    deleting the n boundary characters to obtain n idle bytes; moving backward a character preceding the $n^{th}$ idle byte in the n idle bytes, so that remaining m-n characters in the first information group are recorded in consecutive bytes; and recording, in at least first n bytes of the first information group, the type information and the position information that are of the n boundary characters to obtain the second information group, wherein the second information group comprises the m bytes.

3. The encoding method according to claim 2, wherein:
    if n bytes occupied by the n boundary characters are sufficient to record the type information and the position information that are of the n boundary characters, recording, in at least first n bytes of the first information group, the type information and the position information that are of the n boundary characters to obtain the second information group, wherein the second information group comprises the m bytes comprises:
        recording, in first n bytes of the first information group, the type information and the position information that are of the n boundary characters to obtain the second information group, wherein the second information group comprises the m bytes; or
    if n bytes occupied by the n boundary characters are not sufficient to record the type information and the position information that are of the n boundary characters, recording, in at least first n bytes of the first information group, the type information and the position information that are of the n boundary characters to obtain the second information group, wherein the second information group comprises the m bytes comprises:
        compressing at least one character of the remaining m-n characters in the first information group to make an idle bit appear in the front of the remaining m-n bytes, and recording, in first n bytes of the first information group and in the idle bit, the type information and the position information that are of the n boundary characters to obtain the second information group, wherein the second information group comprises the m bytes.

4. The encoding method according to claim 2, wherein adding header information to the second information group according to a type that is of the first information group and determined by character attributes of the characters in the first information group comprises:

if n bytes occupied by the n boundary characters are not sufficient to record the type information and the position information that are of the n boundary characters, adding the header information to the second information group according to the type that is of the first information group and determined by the character attributes of the characters in the first information group, wherein the header information is used to mark the type of the first information group.

5. The encoding method according to claim 1, wherein: m≤64; and if the prestored type of the information group is an all-data-character type and a non-all-data-character type, the header information of the information group comprises at least two types; or if the prestored type of the information group is an all-data-character type, an all-third-type-character type, and a boundary-character-included type, the header information of the information group comprises at least three types.

6. The encoding method according to claim 1, wherein if the characters in the first information group are all third-type characters, the method further comprises:

compressing at least one third-type character to make an idle bit appear in the front of the first information group; recording, in the idle bit, that the characters in the first information group are all third-type characters to obtain a third information group, wherein the third information group comprises m bytes; and adding header information to the third information group according to the type of the first information group and the correspondence between the prestored type of the information group and the type of the header information of the information group; or adding header information to the first information group according to the type of the first information group and the correspondence between the prestored type of the information group and the type of the header information of the information group, wherein the header information of the first information group is used to mark that the characters in the first information group are all third-type characters.

7. A decoding method of an Ethernet physical layer, the method comprising:

determining a to-be-decoded second information group and header information of the second information group, wherein the second information group comprises m bytes, m≥2, and m is an integer;

determining, according to the header information of the second information group and a prestored type of the information group, that the second information group comprises type information and position information that are of n boundary characters, wherein n≥1, and n is an integer; or that the second information group comprises information that characters are all third-type characters; and if the second information group comprises the type information and the position information that are of the n boundary characters, obtaining n to-be-added boundary characters according to the type information and the position information that are of the n boundary characters, deleting the type information and the position information that are of the n boundary characters, and generating a first information group by using the n to-be-added boundary characters and the characters in the second information group, wherein the first information group comprises m bytes; or if the second information group comprises the information that characters are all third-type characters, deleting the information that characters are all third-type characters, and decompressing a character in the second information group to obtain a first information group, wherein the first information group comprises m bytes.

8. The decoding method according to claim 7, wherein:

if the type information and the position information that are of the n boundary characters are recorded in first n bytes of the second information group, generating a first information group by using the n to-be-added boundary characters and the characters in the second information group, wherein the first information group comprises m bytes comprises:

adding the n to-be-added boundary characters to the second information group to obtain the first information group; or if the type information and the position information that are of the n boundary characters are recorded not only in first n bytes of the second information group, generating a first information group by using the n to-be-added boundary characters and the characters in the second information group, wherein the first information group comprises m bytes comprises:

decompressing a character in the second information group, and adding the n to-be-added boundary characters to the second information group that is obtained after the decompression to obtain the first information group.

9. An encoding apparatus, comprising:

a determining unit configured to determine a to-be-encoded first information group, wherein the first information group comprises m characters, m≥2, and m is an integer, wherein a character attribute of any character is a data character, a boundary character, or a third-type character, one character occupies one byte, and the third-type character is a character except the data character and the boundary character;

a detecting unit configured to detect a character attribute of each character in the first information group;

a generating unit configured to: if the first information group comprises n boundary characters, wherein n≥1, and n is an integer, delete the n boundary characters, and generate a second information group by using a character, except the n boundary characters, in the first information group, and type information and position information that are of the n boundary characters, wherein the second information group comprises m bytes; and an adding unit configured to add header information to the second information group according to a type of the first information group and a correspondence between a prestored type of a information group and a type of header information of the information group, wherein the type of the first information group is determined by the prestored type of the information group and character attributes of the characters in the first information group.

10. The encoding apparatus according to claim 9, wherein the generating unit is configured to:

interchange first n characters in the first information group and the n boundary characters, delete the n boundary characters, and record, in at least first n bytes of the first information group, the type information and the position information that are of the n boundary characters to obtain the second information group, wherein the second information group comprises the m bytes; or delete the n boundary characters to obtain n idle bytes; move backward a character preceding the $n^{th}$ idle byte in the n idle bytes, so that remaining m-n characters in the first information group are recorded in consecutive bytes; and record, in at least first n bytes of the first information group, the type information and the position information that are of the n boundary characters to obtain the second information group, wherein the second information group comprises the m bytes.

11. The encoding apparatus according to claim 10, wherein the generating unit is configured to:

if n bytes occupied by the n boundary characters are sufficient to record the type information and the position information that are of the n boundary characters, record, in first n bytes of the first information group, the type information and the position information that are of the n boundary characters to obtain the second information group, wherein the second information group comprises the m bytes; or if n bytes occupied by the n boundary characters are not sufficient to record the type information and the position information that are of the n boundary characters, compress at least one character of the remaining m-n characters in the first information group, so as to make an idle bit appear in the front of the remaining m-n bytes, and record, in first n bytes of the first information group and in the idle bit, the type information and the position information that are of the n boundary characters to obtain the second information group, wherein the second information group comprises the m bytes.

12. The encoding apparatus according to claim 10, wherein the adding unit is configured to:

if n bytes occupied by the n boundary characters are not sufficient to record the type information and the position information that are of the n boundary characters, add the header information to the second information group according to the type that is of the first information group and determined by the character attributes of the characters in the first information group, wherein the header information is used to mark the type of the first information group.

13. The encoding apparatus according to claim 9, wherein:

m≤64; and if the prestored type of the information group is an all-data-character type and a non-all-data-character type, the header information of the information group comprises at least two types; or if the prestored type of the information group is an all-data-character type, an all-third-type-character type, and a boundary-character-included type, the header information of the information group comprises at least three types.

14. The encoding apparatus according to claim 13, wherein if the characters in the first information group are all third-type characters, the apparatus further comprises a compressing unit, wherein the compressing unit is configured to compress at least one third-type character to make an idle bit appear in the front of the first information group; the generating unit is further configured to record, in the idle bit, that the characters in the first information group are all third-type characters to obtain a third information group, wherein the third information group comprises m bytes; and the adding unit is further configured to add header information to the third information group according to the type of the first information group and the correspondence between the prestored type of the information group and the type of the header information of the information group; or the adding unit is further configured to add header information to the first information group according to the type of the first information group and the correspondence between the prestored type of the information group and the type of the header information of the information group, wherein the header information of the first information group is used to mark that the characters in the first information group are all third-type characters.

* * * * *